(12) United States Patent
Hagiwara

(10) Patent No.: US 11,881,270 B2
(45) Date of Patent: Jan. 23, 2024

(54) DETECTION CIRCUIT, SEMICONDUCTOR MEMORY DEVICE, MEMORY SYSTEM

(71) Applicant: Kioxia Corporation, Tokyo (JP)

(72) Inventor: Yousuke Hagiwara, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 136 days.

(21) Appl. No.: 17/693,948

(22) Filed: Mar. 14, 2022

(65) Prior Publication Data

US 2023/0066800 A1  Mar. 2, 2023

(30) Foreign Application Priority Data

Aug. 24, 2021 (JP) ................. 2021-136470

(51) Int. Cl.
*G11C 16/32* (2006.01)
(52) U.S. Cl.
CPC ..................... *G11C 16/32* (2013.01)
(58) Field of Classification Search
CPC .......................... G11C 16/32; G11C 16/26
USPC .................................... 365/185.19
See application file for complete search history.

(56) References Cited

U.S. PATENT DOCUMENTS

| 6,320,438 | B1 | 11/2001 | Arcus |
| 7,554,844 | B2 * | 6/2009 | Werner ............... G11C 11/5621 |
| | | | 365/185.03 |
| 10,884,674 | B2 | 1/2021 | Hagiwara et al. |

OTHER PUBLICATIONS

Ravezzi, "Duty-cycle detector based on time-to-digital conversion", Electronics Letters, vol. 49, Issue 4, pp. 247-248, 2013.

* cited by examiner

*Primary Examiner* — Huan Hoang
(74) *Attorney, Agent, or Firm* — Holtz, Holtz & Volek PC

(57) ABSTRACT

According to one embodiment, a detection circuit includes a first filter circuit configured to output a first voltage, a ramp circuit configured to output a ramp voltage, a comparator configured to output a first result of comparison between the first voltage and the ramp voltage and a second result of comparison between a second voltage and the ramp voltage, and a controller, wherein the controller determines a first period of time between a time when the ramp voltage output is started and a time when a magnitude correlation between the first voltage and the ramp voltage is inverted, and determines a second period of time between a time when the ramp voltage output is started and a time when a magnitude correlation between the second voltage and the ramp voltage is inverted.

16 Claims, 9 Drawing Sheets

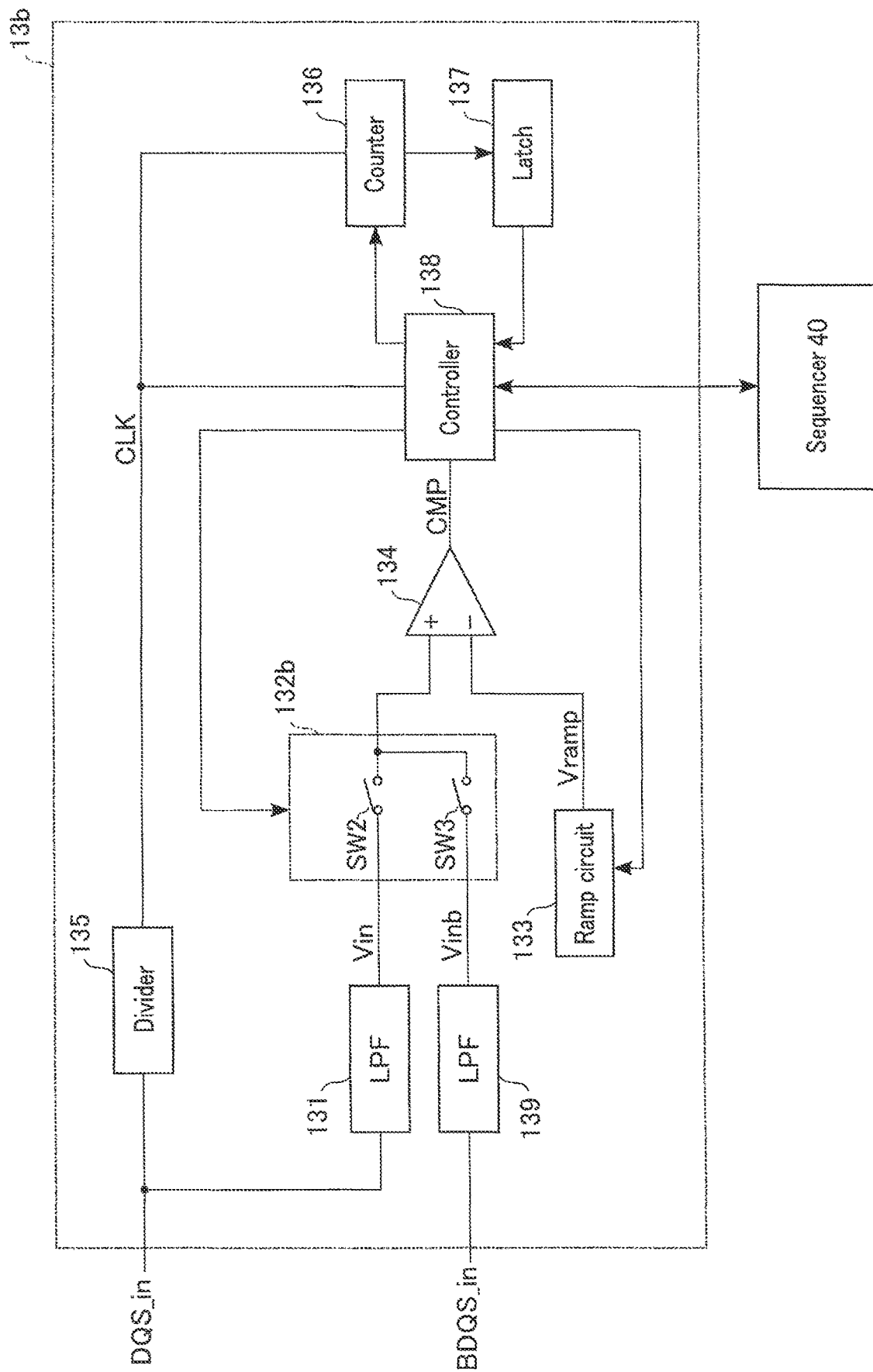
F I G. 9

DETECTION CIRCUIT, SEMICONDUCTOR MEMORY DEVICE, MEMORY SYSTEM

CROSS-REFERENCE TO RELATED APPLICATIONS

This application is based upon and claims the benefit of priority from Japanese Patent Application No. 2021-36470, filed Aug. 24, 2021, the entire contents of which are incorporated herein by reference.

FIELD

Embodiments described herein relate generally to a detection circuit, a semiconductor memory device, and a memory system.

BACKGROUND

A circuit for detecting a duty cycle of a signal is known.

BRIEF DESCRIPTION OF THE DRAWINGS

FIG. 3 is a flowchart illustrating a read operation of the semiconductor memory device according to the embodiment.

FIG. 9 is a circuit diagram showing an example of a configuration of a detection circuit of the semiconductor memory device according to a second modification.

DETAILED DESCRIPTION

In general, according to one embodiment, a detection circuit, a semiconductor memory device, and a memory system include a first filter circuit configured to output a first voltage based on a first signal, a ramp circuit configured to output a ramp voltage, a comparator configured to output a first result of comparison between the first voltage and the ramp voltage and a second result of comparison between a second voltage and the ramp voltage, and a controller, wherein the controller determines, based on the first comparison result, a first period of time between a time when an output of the ramp voltage is started and a time when a magnitude correlation between the first voltage and the ramp voltage is inverted, and determines, based on the second comparison result, a second period of time between a time when an output of the ramp voltage is started and a time when a magnitude correlation between the second voltage and the ramp voltage is inverted.

Hereinafter, the embodiments will be described with reference to the accompanying drawings. In the descriptions below, constituent elements having similar functions and configurations will be denoted by the same reference symbols. The following embodiments illustrate the technical concept. The embodiments are net intended to limit the materials, shapes, structures, arrangements, etc. of the components to those described herein. Various modifications can be made to the embodiments.

[1] Embodiment

A semiconductor memory device according to an embodiment is described.

[1-1] Configuration

[1-1-1] Overall Configuration of Memory System

Figure 1:
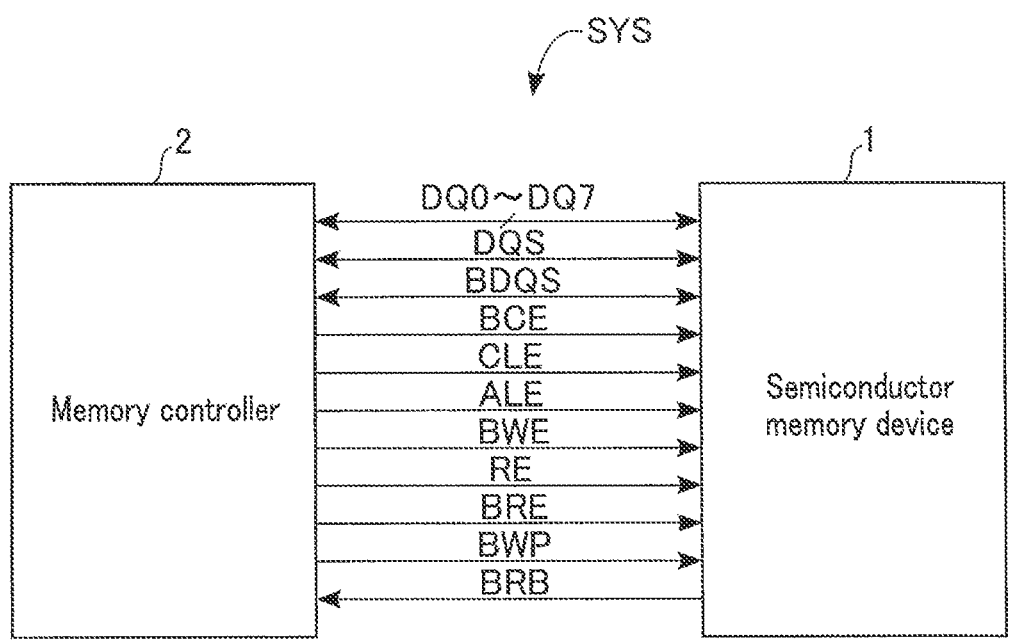
FIG. 1 is a block diagram shoring an example of a configuration of a memory system including a semiconductor memory device according to an embodiment.

FIG. 1 is a block diagram illustrating an example of a configuration of a memory system including a semiconductor memory device according to the embodiment. A memory system SYS is a memory device. The memory system SYS performs a data write operation and a data read operation, etc. in accordance with instructions from an external host device (not shown). As shown in FIG. 1, the memory system SYS includes a semiconductor memory device 1 and a memory controller 2.

The semiconductor memory device 1 is a non-volatile memory. The semiconductor memory device 1 is a NAND-type flash memory, for example.

The memory controller 2 is configured as an integrated circuit such as a system-on-a-chip (SoC), for example. The memory controller 2 controls the semiconductor memory device 1.

The semiconductor memory device 1 is coupled to the memory controller 2 via a NAND bus, for example. A communication via a NAND bus includes signals DQ0 to DQ7, DQS, BDQS, BCE, CLE, ALE, BWE, RE, BRB, BWP, and BRB, for example.

The signals DQ0 to DQ7 are, for example, an eight-bit signal. The signals DQ0 to DQ7 are entities of data transmitted and received between the semiconductor memory device 1 and the memory controller 2. The signals DQ0 to DQ7 may include a command, an address, or data.

The DQS and BDQS are signals for controlling an operation timing for receiving the signals DQ0 to DQ7. The signals DQS and BDQS are transmitted and received between the semiconductor memory device 1 and the memory controller 2.

The signal BCE is a signal for turning the semiconductor memory device 1 to a selected state or a non-selected state. The signal BCE is transmitted from the memory controller 2 to the semiconductor memory device 1.

The signal CLE is a signal for sending a notification that the signals DQ0 to DQ7 are a command. The signal ALE is a signal for sending a notification that the signals DQ0 to DQ7 are an address. The signal BWE is a signal for instructing the semiconductor memory device 1 to take in the signals DQ0 to DQ7. The signals RE and BRE are signals for instructing the semiconductor memory device 1 to output the signals DQ0 to DQ7. In addition, the signals RE and BRE control an operation timing of the. semiconductor memory device 1 when the semiconductor memory device 1 outputs the signals DQ0 to DQ7. The signal BWP is a signal that prohibits the semiconductor memory device 1 from performing write and erasure operations. The signals CLE, ALE, BWE, RE, BRE, and BWP are transmitted from the memory controller 2 to the semiconductor memory device 1.

The signal BRB is a signal that indicates that the semiconductor memory device 1 is either in a ready state (a state of accepting external instructions) or in a busy state (a state of not accepting external instructions). The signal BRB is transmitted from the semiconductor memory device 1 to the memory controller 2.

In the specification, a signal whose initial is "B" means that the signal is asserted at an "L" level. Specifically, the signals BDQS, BCE, BWE, BRE, BWP, and BRB are asserted an "L" level. The signal BDQS is an inversion signal of the signal DQS. The signal BRE is an inversion signal of the signal RE.

The signals DQS and BDQS are sequentially toggled in accordance with transmitted data when the semiconductor memory device 1 transmits the signals DQ0 to DQ7 to the memory controller 2, for example. The signals DQS and BDQS that are sequentially toggling can be regarded as clock signals during a period in which the signals are sequentially toggling. As for the signals RE and BRE, they can also be regarded as clock signals during a period in which the signals RE and BRE are sequentially toggling. In the present specification, the signals DQS, BDQS, RE, and BRE, and the signals relating thereto are described in terms of the clock frequency and duty cycle of each signal, focusing on the states that can be regarded as clock signals.

[1-1-2] Structure of Semiconductor Memory Device 1

(Overall Configuration of Semiconductor Memory Device 1)

Figure 2:
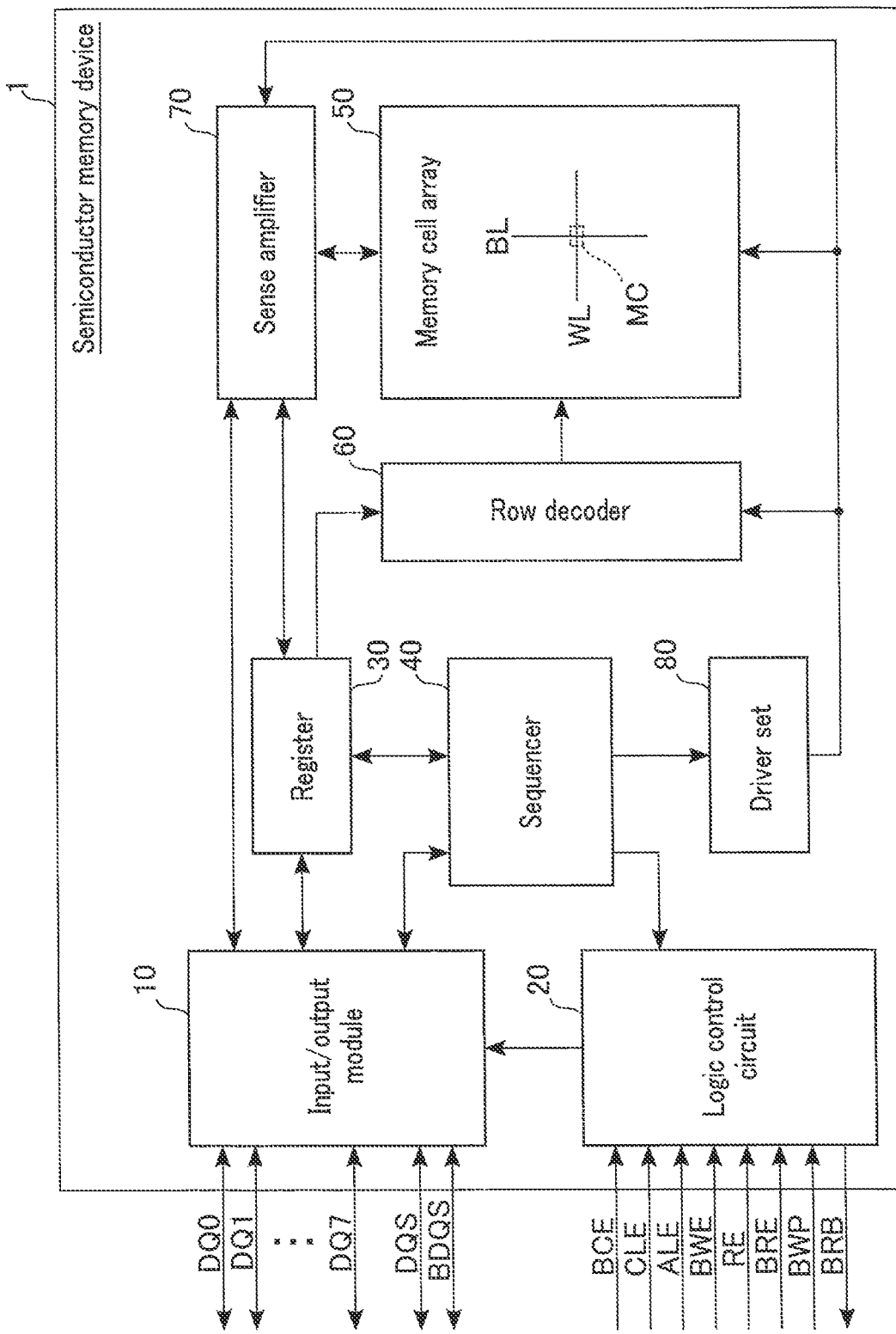
FIG. 2 is a block diagram showing an example of a configuration of the semiconductor memory device according to the embodiment.

FIG. 2 is a block diagram showing an example of the configuration of a semiconductor memory device according an embodiment. As shown in FIG. 2, the semiconductor memory device 1 includes an input/output module 10, a logic control circuit 20, a register 30, a sequencer 40, a memory cell array 50, a row decoder 60, a sense amplifier 70, and a driver set 80.

The input/output module 10 receives the signals DQ0 to DQ7, DQS and BDQS from the memory controller 2. The input/output module 10 transmits commands and addresses of the received signals DQ0 to DQ7 and write data to the register 30 and the sense amplifier 70. The input/output module 10 transmits the signals DQ0 to DQ7, DQS, and BDQS to the memory controller 2. The input/output module 10 generates the signals DQ0 to DQ7 based on read data from the sense amplifier 70. The input/output module 10 generates the signals DQS and BDQS based on reference signals from the logic control circuit 20.

The logic control circuit 20 receives the signals BCE, CLE, ALE, BWE, RE, BRE, and BWP from the memory controller 2. The logic control circuit 20 generates a reference signal based on the signals RE and BRE. The logic control circuit 20 transmits the signal BRE to the memory controller 2.

The register 30 temporarily stores the commands and addresses received via the input/output module 10. The register 30 transfers the address to the row decoder 60 and the sense amplifier 70. The register 30 transfers the command to the sequencer 40.

The sequencer 40 controls the overall operation of the semiconductor memory device 1. For example, the sequencer 40 receives a command from the register 30 and performs a read operation, etc. based on the received command. The sequencer 40 controls an operation of generating a reference signal in the logic control circuit 20 based on the output of the input/output module 10.

The memory cell array 50 stores data in a non-volatile manner. The memory cell array 50 includes a plurality of bit lines BL, a plurality of word lines WL, and a plurality of memory cells MC. A plurality of memory cells MC are arranged in an array in a row direction and a column direction, for example. A plurality of bit lines BL are provided in a column direction and each bit line BL is coupled to a plurality of memory cells MC of a column. A plurality of word lines WL are provided in correspondence to a row direction and each word line WL is coupled to a plurality of memory cells MC corresponding to a column.

The row decoder 60 receives a row address in an address from the register 30, and selects memory cells MC of a row based on the row address. A voltage from the driver sec 80 is transferred to the memory cells MC of the selected row via the row decoder 60.

The sense amplifier 70 senses a threshold voltage of a memory cell MC when data is read, and transfers read data based on the sensing result to the input/output module 10. The sense amplifier 70 also receives a column address in the address from the register 30, and outputs data of a column based on the column address, when data is written, the sense amplifier 70 transfers write data slated to be written via a bit line BL to the memory cells MC.

The driver set 80 generates the voltages used for the operations in the memory cell array 50, the row decoder 60, and the sense amplifier 70.

(Detailed Configuration of Semiconductor Memory Device 1)

Figure 3:
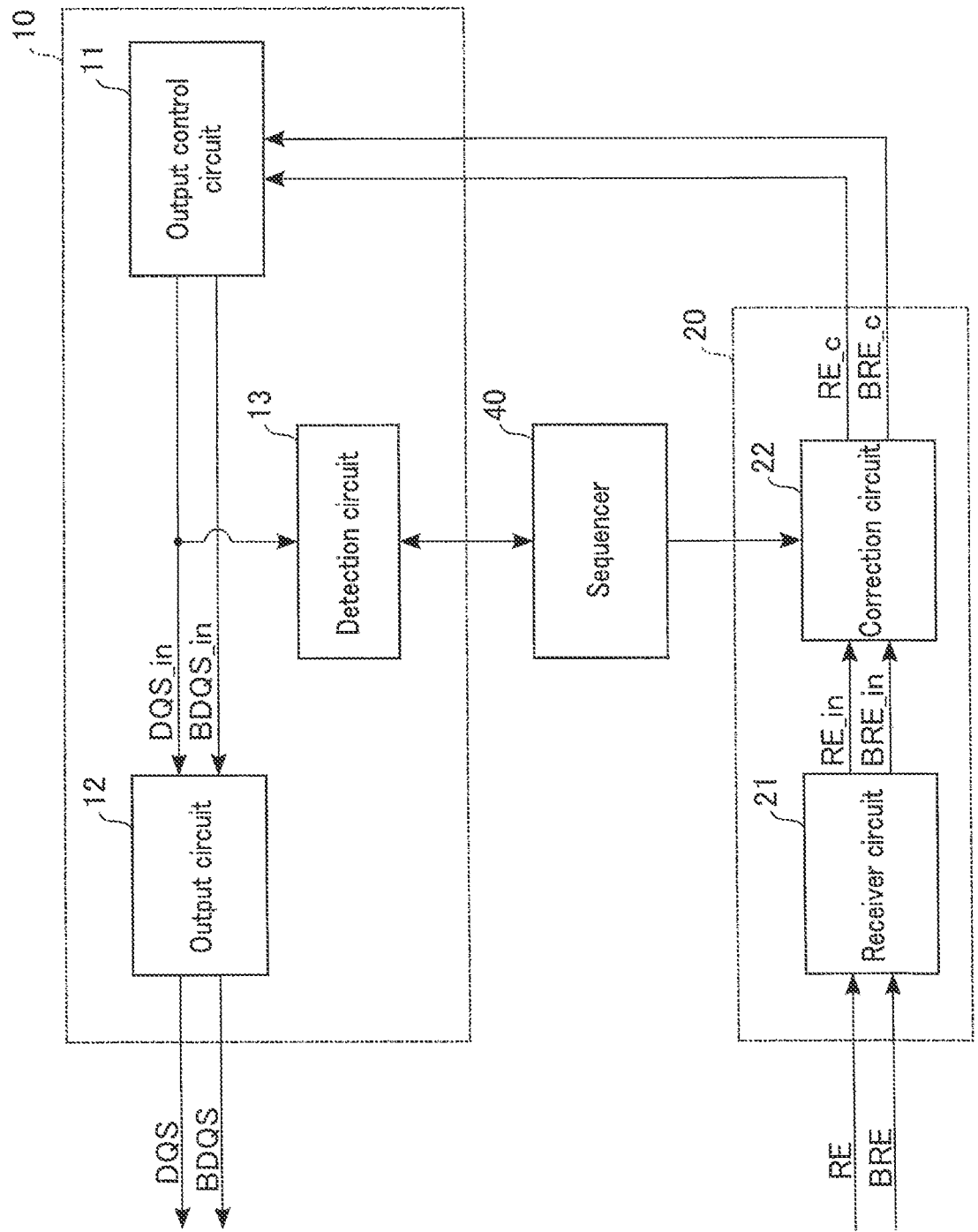
FIG. 3 is a block diagram showing an example of configurations of an input/output module, a logic control circuit, and a sequencer of the semiconductor memory device according to the embodiment.

FIG. 3 is a block diagram showing an example of configurations of an input/output module 10, a logic control circuit 20, and a sequencer 40 of the semiconductor memory device according to the embodiment. FIG. 3 illustrates the selected structures relating to an operation of generating the signals DQS and BDQS in the input/output module 10 and an operation of generating a reference signal in the logic control circuit 20. As shown in FIG. 3, the input/output module 10 includes an output control circuit 11, an output circuit 12, and a detection circuit 13. The logic control circuit 20 includes a receiver circuit 21 and a correction circuit 22.

The receiver circuit 21 receives the signals RE and BRE from the memory controller 2. The receiver circuit 21 generates the signals RE_in and BRE_in based on the signals RE and BRE. The signals RE_in and BRE_in are signals obtained by shaping the signals RE and BRE at a logic voltage level in the semiconductor memory device 1.

The correction circuit 22 receives the signals RE_in and BRE_in from the receiver circuit 21. The correction circuit 22 corrects the duty cycle of each of the signals RE_in and BRE_in. An amount of correction made to the duty cycle by the correction circuit 22 is set by the sequencer 40. The correction circuit 22 generates signals RE_c and BRE_c as a result of the correction. The signals RE_c and BRE_c are used as reference signals for determining operation timing in the semiconductor memory device 1.

The output control circuit 11 receives the signals RE_c and BRE_c as reference signals. The output control circuit 11 generates the signals DQS_in and BDQS_in based on the signals RE_c and BRE_c. The signals DQS_in and BDQS_in are signals that serve as bases for the signals DQS and BDQS. The duty cycle of the signal DQS_in is equal to that of the signal DQS. The duty cycle of the signal BDQS_in is equal to that of the signal BDQS.

The output circuit 12 receives the signals DQS_in and BDQS_in. The output circuit 12 generates the signals DQS and BDQS based on the signals DQS_in and BDQS_in. The output circuit 12 transmits the signals DQS and BDQS from the memory controller 2.

The detection circuit 13 receives the signal DQS_in. The detection circuit 13 detects information relating to the duty cycle of the signal DQS_in.

The sequencer 40 controls an amount of correction made to the duty cycle by the correction circuit 22 based on information relating to the duty cycle detected by the detection circuit 13.

(Configuration of Detection Circuit 13)

Figure 4:
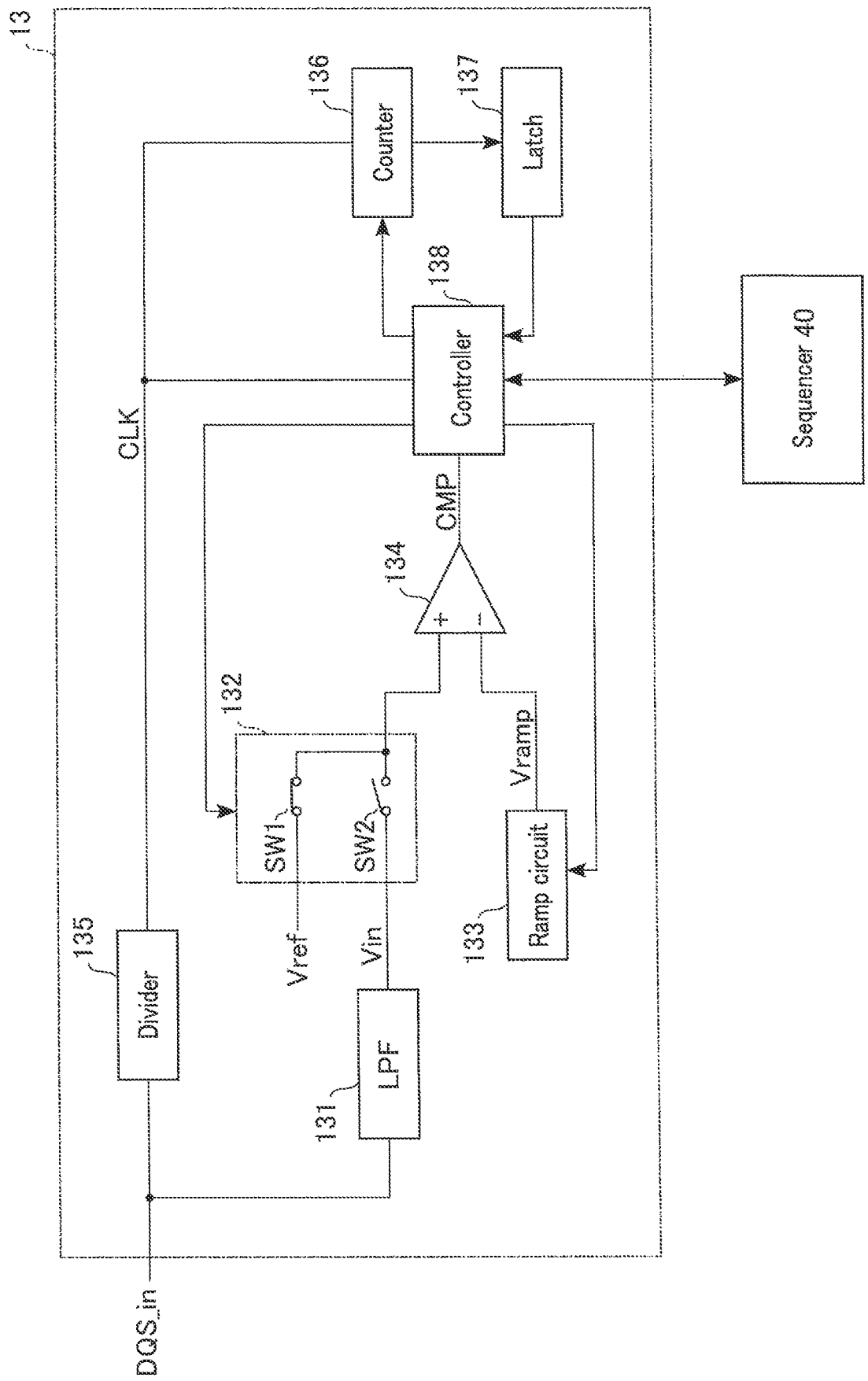
FIG. 4 is a circuit diagram showing an example of a configuration of a detection circuit of the semiconductor memory device according to the embodiment.

FIG. 4 is a block diagram showing an example of the configuration of the detection circuit of the semiconductor memory device according to the embodiment. As shown in FIG. 4, the detection circuit 13 includes an LPF 131, a selector 132, a ramp circuit 133, a comparator 134, a divider 135, a counter 136, a latch 137, and a controller 138.

The LPF 131 is a low pass filter. The LPF 131 is a type of a filter circuit. The LPF 131 is a passive-type, primary low pass filter that includes a resistance and a capacitor, for example. The LPF 131 attenuates a high-frequency component of an input signal and outputs a low frequency component. The cut-off frequency of the LPF 131 is sufficiently lower than the frequency of the signal DQS_in. The signal DQS_in is input to the LPF 131. The LPF 131 outputs a voltage Vin.

The high-frequency component of a clock signal is a fundamental wave corresponding to a clock frequency of a clock signal and its harmonic. The low-frequency component of the clock signal is a low-frequency signal corresponding to a duty cycle of a clock signal, namely a direct-current voltage corresponding to a duty cycle of a clock signal. Therefore, the LPF 131 to which the signal DQS_in in a state that allows it to be regarded as a clock signal is input outputs a voltage Vin at an amplitude corresponding to the duty cycle of the signal DQS_in. For example, the duty cycle of the signal DQS_in is 50%, and the magnitude of the voltage Vin is 50% of the voltage amplitude of the signal DQS_in.

The selector 132 selects one voltage from a plurality of input voltages and outputs the selected voltage. The selector 132 includes switches SW1 and SW2. A voltage Vref is input to the selector 132 via the switch SW1. The voltage in is input to the selector 132 via the switch SW2. The voltage Vref is a direct-current voltage. The voltage Vref is a direct-current voltage having ½ the voltage amplitude of the signal DQS_in, for example.

The ramp circuit 133 outputs 0 V or a ramp voltage. The ramp voltage is a voltage varying in its amplitude in accordance with an elapsed time. The amplitude of the ramp voltage and the elapsed time correspond to each other uniquely. The relationship between the amplitude of the ramp voltage and the elapsed time may be expressed by a first-order function, for example. In the present embodiment, an example where the ramp circuit 133 outputs a ramp voltage that is increased in accordance with the elapsed time is described. The output voltage of the ramp circuit 133 is called "Vramp".

The comparator 134 compares an output of the selector 132 with an output of the ramp circuit 133, and outputs a comparison result as a signal CMP. Specifically, an output of the selector 132 is input to the non-inverted input terminal of the comparator 134. An output of the ramp circuit 133 is input to the inverted input terminal of the comparator 134.

The divider 135 divides an input signal and outputs the divided signal. The signal DQS_in is input to the divider 135. The divider 135 outputs a signal CLK obtained by dividing the signal DQS_in.

The control signal CLK is input to the counter 136. The counter 136 performs a count operation based on the signal CLK. Specifically, the counter 136 counts up a count value in a count operation every time the signal CLK rises. In other words, the operation timing of the counter 136 is determined by the signal CLK. The counter 136 outputs a count value to the latch 137.

The latch 137 stores two count values.

The controller 138 controls the selector 132, the ramp circuit 133, and the counter 136 based on the signal CMP and the signal CLK. Specifically, the controller 138 selects a voltage that is output by the selector 132. The controller 138 causes the ramp circuit 133 to output 0 V or a ramp voltage. The controller 138 causes a count operation to commence in accordance with a timing at which the output of a ramp voltage is started. The controller 138 determines, based on the signal CMP, a period of time between when the output of a ramp voltage is started and when the magnitude correlation between the voltage Vin and the ramp voltage is reversed, and causes the latch 137 to store count values corresponding to this period. The controller 138 determines, based on the signal CMP, a period of time between when the output of a ramp voltage is started and when the magnitude correlation between the voltage Vref and the ramp voltage is reversed, and causes the latch 137 to store count values corresponding to this period. The controller 138 transmits the sequencer 40 as a result of detection of two count values stored in the latch 137 in accordance with a detection order from the sequencer 40.

[1-2] Operation (Read Operation)

Figure 5:
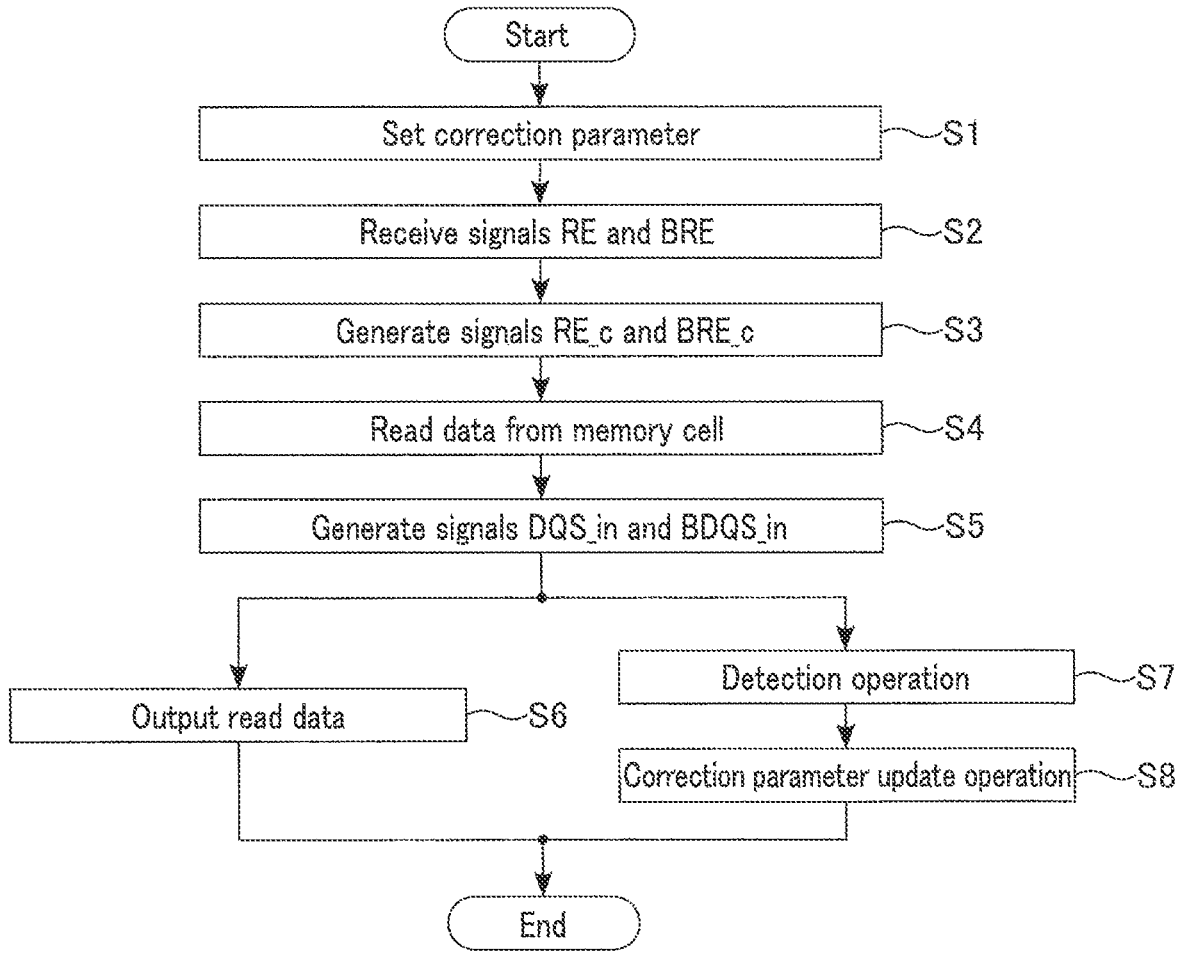

FIG. 5 is a flowchart illustrating a read operation of the semiconductor memory device according to the embodiment. Hereinafter, the read operation of the semiconductor memory device 1 is described with reference to FIG. 5.

When the semiconductor memory device 1 receives a read command from the memory controller 2 (Start), the sequencer 40 sets a correction parameter (S1). Specifically, the sequencer 40 sets, in the correction circuit 22, a correction parameter for determining a correction amount of the duty cycle.

The receiver circuit 21 receives the signals RE and BRE from the memory controller 2 (S2). The receiver circuit 21 generates the signals RE_in and BRE_in based on the signals RE and BRE.

The correction circuit 22 generates the signals RE_c and BRE_c (S3). Specifically, the correction circuit 22 corrects the duty cycle of the signals RE_in and BRE_in based on the correction parameter, and generates the signals RE_c and BRE_c as a correction result.

The semiconductor memory device 1 reads data from the memory cells (S4). Specifically, the sequencer 40 controls the row decoder 60, the sense amplifier 70, and the driver set 80, and the data stored in the memory cells MC is read and output to the sense amplifier 70.

The output control circuit 11 receives the signals DQS_in and BDQS_in (S5). Specifically, the output control circuit 11 generates the signals DQS_in and BDQS_in based on the signals RE_c and BRE_c.

The semiconductor memory device 1 performs the output of the read data (S6), the detection operation (S7), and the correction parameter update operation (S8) in parallel.

The semiconductor memory device 1 outputs the read data (S6). Specifically, the output circuit 12 generates the signals DQS and BDQS based on the signals DQS_in and BDQS_in, and outputs the generated signals to the memory controller 2. The input/output module 10 generates the signals DQ0 to DQ7 based on the signals DQS and BDQS and the read data, and outputs the generated signals to the memory controller 2.

The detection circuit 13 performs a detection operation (S7). Specifically, the detection circuit 13 detects information relating to the duty cycle of the signal DQS_in and transmits a detection result to the sequencer 40.

The sequencer 40 performs the correction parameter update operation (S8). Specifically, the sequencer 40 updates the correction parameter based on the correction parameter that is set in the correction circuit 22 in the process in S1 and the detection result received from the detection circuit 13, in such a manner that the duty cycle of the signal DQS_in becomes 50%.

When the output of the read data and the correction parameter update operation are finished, the semiconductor memory device 1 finishes the read operation (End).

Figure 6:
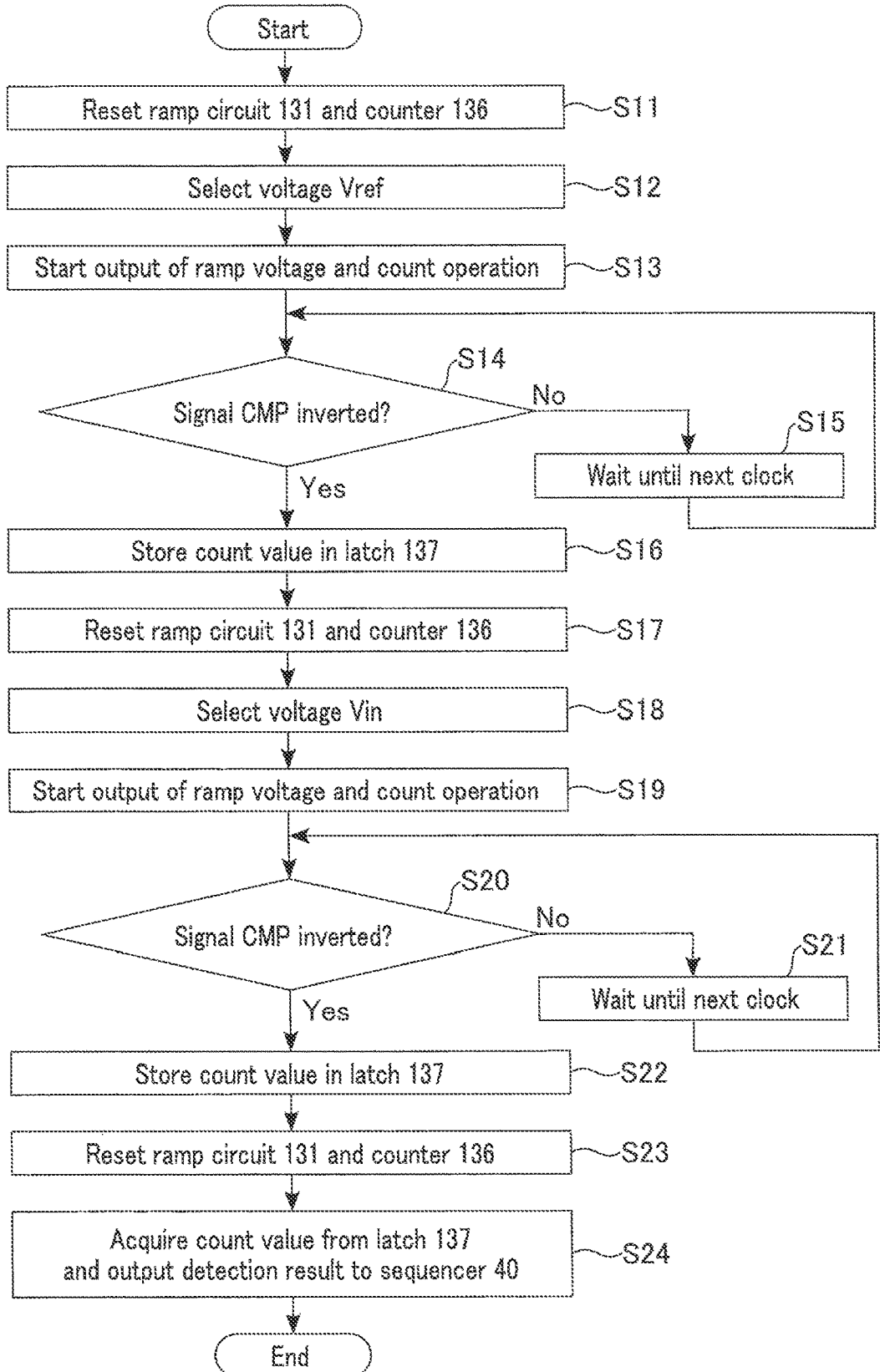
FIG. 6 is a flowchart illustrating a detection operation in the semiconductor memory device according to the embodiment.

FIG. 6 is a flowchart illustrating a detection operation in the semiconductor memory device according to the embodiment. Next, the detection operation of the detection circuit 13 is described with reference to FIG. 6.

The controller 138 receives a detection order from the sequencer 40 (Start) and the controller 138 resets the ramp circuit 133 and the counter 136 (S11). Specifically, the controller 138 controls the ramp circuit 133 and sets the output voltage 0 V. The controller 138 controls the counter 136, initializes the counter value, and stops the count operation.

The controller 138 selects the voltage Vref as a voltage to be input into the non-inverted input terminal of the comparator 134 (S12). Specifically, the controller 138 controls the selector 132 so as to select a voltage Vref to be input to the non-inverted input terminal of the comparator 134. For example, the controller 138 turns on the switch SW1 and turns off the switch SW2 in order to select the voltage Vref.

The controller 138 causes the output of the ramp voltage and the count operation to commence (S13). Specifically, the controller 138 controls the ramp circuit 133 to commence the output of the ramp voltage, and controls the counter 136 to commence the count operation.

The controller 138 determines whether or not the signal CMP is inverted or not (S14). Specifically, the controller 138 determines whether or not the signal CMP is inverted from an "H" level to an "L" level.

When the signal CMP is not inverted (No in S14), the controller 138 waits for the next clock (S15). Upon input of the next clock, the controller 138 performs the process in S4.

When the signal CMP is inverted (Yes in S14), the controller 138 causes the latch 137 to store the count value (S16). The count value stored when the voltage Vref is selected is called a "count value Nref".

The controller 138 resets the ramp circuit 133 and the counter 136 (S17). Specifically, the controller 138 controls the ramp circuit 133 and sets the output voltage to 0 V. The controller 138 controls the counter 136, initializes the counter value, and stops the count operation.

The controller 138 selects the voltage Vin as a voltage to be input into the non-inverted input terminal of the comparator 134 (S18). Specifically, the controller 138 controls the selector 132 so as to select a voltage Vin to be input to the non-inverted input terminal of the comparator 134. For example, the controller 138 turns on the switch SW2 and turns off the switch SW1 so as to select the voltage Vin.

The controller 138 causes the output of the ramp voltage and the count operation to commence (S19). Specifically, the controller 138 controls the ramp circuit 133 to cause the output of the ramp voltage to commence, and controls the counter 126 to cause the count operation to commence.

The controller 138 determines whether or not the signal CMP is inverted or not (S20). Specifically, the controller 138 determines whether or not the signal CMP is inverted from an "H" level to an "L" level.

When the signal CMP is not inverted (No in S20), the controller 138 waits for the next clock (S21). Upon input of the next clock, the controller 138 performs the process in S10.

When the signal CMP is inverted (Yes in S20), the controller 138 causes the latch 137 to store the count value (S22). The count value stored whet the voltage Vin is selected is called a "count value Nin".

The controller 128 resets the ramp circuit 133 and the counter 136 (S23). Specifically, the controller 138 controls the ramp circuit 133 and sets the output voltage to 0 V. The controller 138 controls the counter 136, initializes the counter value, and stops the count operation.

The controller 138 obtains the count value from the latch 137 and outputs a detection result to the sequencer 40 (S24). Specifically, the controller 138 obtains the count values Nref and Nin from the latch 137 and outputs these count values to the sequencer 40 as a detection result.

Upon output of the detection result, the controller 138 finishes the detection operation (End).

Figure 7:
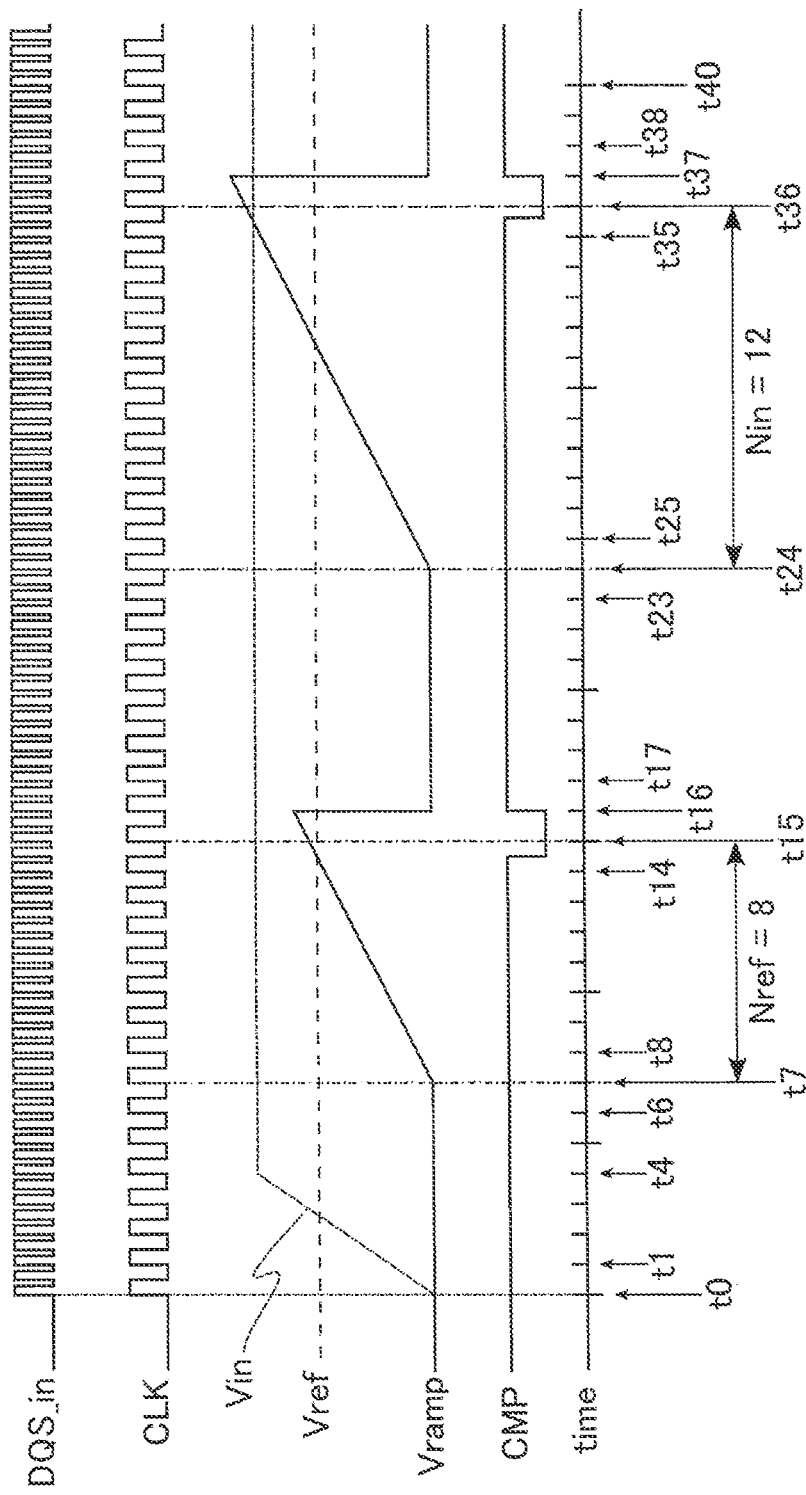
FIG. 7 is a waveform diagram showing a detection operation in the semiconductor memory device according to the embodiment.

FIG. 7 is a waveform diagram showing a detection operation in the semiconductor memory device according to the embodiment. FIG. 7 shows the signal DQS_in, the signal CLK, the voltage Vramp, the voltage Vref, the voltage Vin, and the signal CMP. The voltage Vref is indicated by a coarse dotted line. The voltage Vin is indicated by a dense dotted line.

For the sake of brevity, in the example shown in FIG. 7, the configuration of the detection circuit 13 and the status at time to and therebefore are set in the following manner. The divider 135 outputs the signal CLK obtained by dividing the signal DQS_in into halves. The selector 132 is set to a state in which the voltage Vref is being selected before time t0. The ramp circuit 133 is reset before time t0. The signal DQS_in is at an "L" level when the signal is in a state where the signal RE is not input to the semiconductor memory device 1 before time t0. The signal CLK is at an "L" level if the signal DQS_in does not oscillate and is at an "L" level before time t0.

Time t0 corresponds to a timing at which the signal DQS_in starts oscillating. At time t0, the signal DQS_in starts oscillating based on the signal RE that is input from outside of the semiconductor memory device 1. At time t0, the signal CLK starts oscillating as the signal DQS_in starts oscillating. Time t0 through time t4 correspond to the order of the timing at which the signal CLK rises. At time t0, the voltage Vramp is 0 V. At time t0, the voltage Vin is 0 V, as the signal DQS_in that is input to the LPF 131 is at an "L" level. At time t0, the signal CMP is at an "H" level, as the voltage Vref is greater than the voltage Vramp.

At time t0 and thereafter, the voltage Vin is increased up to a voltage corresponding to the low-frequency component of the signal DQS_in, as the signal DQS_in that is input to the LPF 131 starts oscillating. In the example shown in FIG. 7, the voltage Vin reaches a voltage corresponding to the low-frequency component of the signal DQS_in at time t4, and this voltage is maintained at time t4 and thereafter.

The period between time t1 to time t6 corresponds to a period from a time when a detection operation is commenced to a time when the process in S11 and the process in S12 are performed. The selector 132 outputs the voltage Vref.

Time t7 corresponds to a timing at which the process in S13 is performed. At time t7, the ramp circuit 133 commences the output of the ramp voltage. The voltage Vramp starts increasing at time t7.

Each of times t8 through t14 corresponds to a timing at which the process in S14 and the process in S15 are performed. At time t8, the signal CMP is at an "H" level, as the voltage Vref is greater than the voltage Vramp. Since the signal CMP is not inverted, the process in S14 is "No", and the process in S15 is performed. The voltage Vramp increases as time elapses; on the other hand, the voltage Vref is larger than the voltage Vramp at any of times t8 to t14, and the signal CMP is at an "H" level. For this reason, between times t8 to t14, the process in S14 is always "No" and the process in S15 is performed.

At a time between time t14 and time t15, the voltage Vramp becomes greater than the voltage Vref, and the signal CMP is inverted to an "L" level.

Time t15 corresponds to a timing at which the process in S14 and the process in S16 are performed. At time t15, the signal CMP is at an "L" level. Since the signal CMP is inverted, the process in S14 is "Yes", and the process in S16 is performed. Since the signal CLK rises eight times between time t7 corresponding to a timing at which the process in S13 is performed to time t15 corresponding to a timing at which the processing S16 is performed, "8" is stored in the latch 137 as a count value Nref.

The time t16 corresponds to a timing at which the process in S17 is performed. At time t16, the voltage Vramp is 0 V. Since the voltage Vramp becomes smaller than the voltage Vref, the signal CMP is turned to an "H" level.

The period between time t17 to time t23 corresponds to a period during which the process in S18 is performed. The selector 132 outputs the voltage Vin.

The time t24 corresponds to a timing at which the process in S19 is performed. At time t24, the ramp circuit 133 commences the output of the ramp voltage. The voltage Vramp starts increasing at time t24.

Each of times t25 through t35 corresponds to a timing at which the process in S20 and the process in S21 are performed. At time t25, the signal CMP is at an "H" level, as the voltage Vin is greater than the voltage Vramp. Since the signal CMP is not inverted, the process in S20 is "No", and the process in S21 is performed. The voltage Vramp increases as time elapses; on the other hand, the voltage Vin is larger than the voltage Vramp at any of times t25 to t35, and the signal CMP is at an "H" level. For this reason, between times t25 to t35, the process in S20 is always "No" and the process in S21 is performed.

At a time between time t35 and time t36, the voltage Vramp becomes greater than he voltage Vin, and the signal CMP is inverted to an "L" level.

Time t36 corresponds to a timing at which the process in S20 and the process in S22 are performed. At time t36, the signal CMP is at an "L" level. Since the signal CMP is inverted, the process in S20 is "Yes", and the process in S22 is performed. Since the signal CLK rises twelve times between time t24 corresponding to a timing at which the process in S19 is performed to time t36 corresponding to a timing at which the processing S22 is performed, "12" is stored in the latch 137 as a count value Nin.

The time t37 corresponds to a timing at which the process in S23 is performed. At time t37, the voltage Vramp is 0 V. Since the voltage Vramp becomes smaller than the voltage Vin, the signal CMP is turned to an "H" level.

A time after time t38 corresponds to a timing at which the process in S24 is performed. In the process in S24, the controller 138 obtains "8" as a count value Nref and "12" as a count value Nin from the latch 137. Furthermore, the controller 138 transmits the count value Nref and the count value Nin to the sequencer 40 as a detection result.

The sequencer 40 that receives the detection result performs an operation of correction parameter update based on the current correction parameter and the received detection result. Specifically, the sequencer 40 divides the count value Nin ("12") by the count value Nref ("8"). Thus, the duty cycle of the signal DQS_in is calculated to be 1.5 times the reference duty cycle. Based on this, the sequencer 40 updates the correction parameter based on a table prepared in advance in such a manner that the duty cycle of the signal DQS_in is 1.0 times the reference duty cycle. Thus, in the semiconductor memory device 1, the detection operation and the correction parameter update operation are performed in such a manner that the duty cycle of the signal DQS_in becomes 50%.

[1-3] Effects

According to the semiconductor memory device of the above-described embodiment, it is possible to correct the duty cycle of a high-rate signal DQS with a high accuracy and speed. Hereinafter, effects of a semiconductor memory device according to an embodiment will be described.

The detection circuit 13 according to the embodiment includes the LPF 131. The LPF 131 interrupts a frequency component of the signal DQS_in and outputs a low-frequency component of the signal DQS_in. In other words, the LPF 131 can output a voltage Vin of a magnitude corresponding to the duty cycle of the signal DQS_in, without being influenced by the increase in a clock frequency of the signal DQS_in. For this reason, the detection circuit 13 including the LPF 131 is suitable for detecting a duty cycle of a high-frequency signal.

The detection circuit 13 according to the embodiment determines a first period during which the output of the ramp circuit 133 exceeds the voltage Vref and a second period during which the output of the ramp circuit 133 exceeds the voltage Vin. Then, the sequencer 40 determines the duty cycle of the signal DQS_in based on these two periods. Specifically, the sequencer 40 calculates a ratio between the count value Nref of the voltage Vref and the count value Nin of the voltage Vin. It is thereby possible to suppress the influence of common causes of errors between the first period and the second period upon the result of the duty cycle determination. Specifically, it is possible to suppress influences of the temperature of the surrounding environment of the semiconductor memory device 1, the fluctuations in the voltage supplied to the semiconductor memory device 1, the manufacturing errors in the ramp circuit 133 and the comparator 134, and the like imposed on the result of a duty cycle determination. For this reason, the semiconductor memory device 1 is able to correct the duty cycle with high accuracy.

In the semiconductor memory device according to the embodiment, the detection circuit outputs a detection result, and the sequencer 40 determines a new correction parameter based on a current correction parameter and a detection result. Thus, the semiconductor memory device of the present embodiment can determine a new correction parameter without changing the operation in the correction circuit 22. For this reason, the semiconductor memory device according to the embodiment can perform a detection operation and a correction parameter update operation in parallel with a read operation. It is thereby possible for the semiconductor memory device according to the embodiment to improve the operation efficiency and operate at a high rate.

[2] Modifications, Etc.

In the foregoing embodiment, an example in which the signal DQS_in is input to the detection circuit 13 and the sequencer 40 updates a correction parameter based on a detection result that is output by the detection circuit 13 is explained. The detection circuit may output a detection result based on the signal BDQS_in in addition to the voltage Vref and the signal DQS_in, for example. The detection may output a detection result based on the signals DQS_in and BDQS_in, regardless of the voltage Vref.

Figure 8:
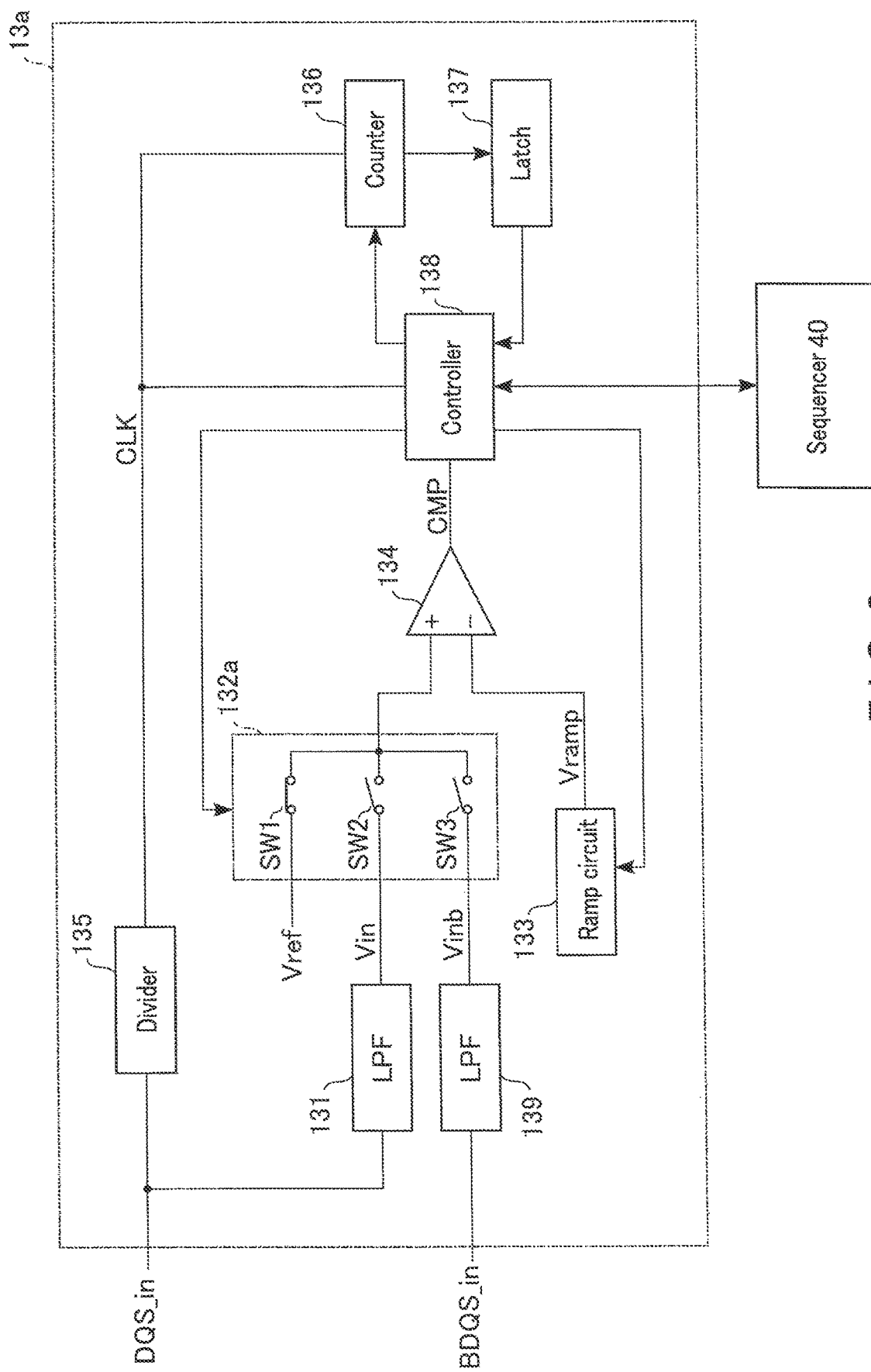
FIG. 8 is a circuit diagram showing an example of a configuration of a detection circuit of a semiconductor memory device according to a first modification.

FIG. 8 is a circuit diagram showing an example of a configuration of a detection circuit of a semiconductor memory device according to a first modification. As shown in FIG. 8, the detection circuit 13a differs from the detection circuit 13 in that the selector 132 is replaced with the selector 132a and the former further includes an LPF 139.

The LPF 139 is a low-pass filter having a structure similar to that of the LPF 131. The signal BDQS_in is input to the LPF 139. The LPF 139 outputs a voltage Vinb. The voltage Vinb is a voltage having a magnitude based on a duty cycle of the signal BDQS_in.

The selector 132a selects one voltage from a plurality of input voltages and outputs the selected voltage. The selector 132a includes the switches SW1 to SW3. The selector 132a inputs a voltage Vref via the switch SW1, inputs the voltage Vin via the switch SW2, and inputs the voltage Vinb via the switch SW3. The other configuration of the detection circuit 13a is similar to that of the detection circuit 13.

The detection circuit 13a transmits to the sequencer 40 the count value Nref stored when the voltage Vref is selected, the count value Nin stored when the voltage Vin is selected, and the count value Ninb stored when the voltage Vinb is selected as a detection result. The sequencer 40 that has received the detection result from the detection circuit 13a calculates a relationship between a duty cycle of the signal DQS_in and a reference duty cycle by dividing the count value Nin by the count value Nref, and calculates the relationship between a duty cycle of the signal BDQS_in and a reference duty cycle by dividing the count value Ninb by the count value Nref to perform an operation of updating a correction parameter.

Thus, the semiconductor memory device according to the first modification determines the duty cycle of the signal DQS_in and the duty cycle of the signal BDQS_in and updates the correction parameter. It is thereby possible for the semiconductor memory device according to the first embodiment to correct the duty cycle of each of the signals DQS and BDQS with a high accuracy.

FIG. 9 is a circuit diagram showing an example of a configuration of a detection circuit of a semiconductor memory device according to a second modification. As shown in FIG. 9, the detection circuit 13b differs from the detection circuit 13a n that the selector 132a is replaced with the selector 132b.

The selector 132b differs from the selector 132a in that the former does not include the switch SW1. The selector 132b selects one voltage from a plurality of input voltages and outputs the selected voltage. The selector 132b includes switches SW2 and SW3. The selector 132b inputs a voltage Vin via the switch SW2 an inputs the voltage Vinb via the switch SW3. The other configuration of the detection circuit 13b is similar to that of the detection circuit 13a.

The detection circuit 13b transmits to the sequencer 40 the count value Nin, which is stored when the voltage Vin is selected, and the count value Ninb, which is stored when the voltage Vinb is selected, as a detection result. The sequencer 40 that has received the detection result from the detection circuit 13b calculates a relationship between a duty cycle of the signal BDQS_in and a reference duty cycle by dividing the count value Nin by the count value Ninb to perform an operation of updating a correction parameter.

Thus, the semiconductor memory device according to the second modification updates the correction parameter based on the signals DQS_in and BDQS_in, without being based on the voltage Vref. Even when the detection circuit is configured in such a manner, the semiconductor memory device according to the second modification can achieve advantageous effects similar to those in the foregoing embodiment.

In the foregoing embodiment, an example where the ramp circuit 133 outputs a ramp voltage that is increased in accordance with the elapsed time was described. The ramp circuit 133 may output a ramp voltage that is lowered in accordance with the elapsed time. For example, the ramp circuit 133 may output a ramp voltage that is lowered from a voltage having the same height as the amplitude of the signal DQS_in in accordance with a length of time elapsed.

In the foregoing embodiment, an example in which the detection operation and the correction parameter updating operation are performed in parallel to the read operation is explained. The detection operation may be performed at a timing that differs from the timing of the read operation. For example, the semiconductor memory device 1 may perform a detection operation when the command instructing a detection operation and the signals RE and BRE are received from the memory controller 2.

In the foregoing embodiment, an example in which the voltage Vref is selected and the count value Nref is stored and then the voltage Vin is selected and the count value Nin is stored in a detection operation was explained. The order in the selection of the voltages by the selector 132 is not limited to the example described in the embodiment. For example, the voltage Vin is selected and the count value Nin is stored and then the voltage Vref is selected and the count value Nref is stored.

In the foregoing embodiment, an example in which an operation selecting the voltage Vref and storing the count value Nref and an operation of selecting the voltage Vin and storing the count value Nin are consecutively performed in a detection operation was explained. The operation of selecting the voltage Vref and storing the count value Nref and the operation of selecting the voltage Vin and storing the count value Nin may be performed at different timings if a change in the environment in which the semiconductor memory device 1 is situated is small. Specifically, if the temperature change in the environment where the semiconductor memory device 1 is situated is small, for example, other operations, for example a write operation, may be performed between the operation of selecting the voltage Vref and storing the count value Nref and the operation of selecting the voltage Vin and storing the count value Nin. If the temperature change in the environment in which the semiconductor memory device 1 is situated is small, the count value Nref stored in a previous detection operation may be used and a count value Nin may be newly obtained to calculate a detection result.

In the foregoing embodiment, an example wherein the LPF 131 is configured to output a voltage Vin having 50% of the voltage amplitude of the signal DQS_in upon input of the signal DQS_in having 50% of the duty cycle was explained. It suffices that the LPS 131 is configured to output a voltage of a magnitude based on a duty cycle of an input signal, and the relationship between the duty cycle of the input signal and the magnitude of the output voltage is not limited to the example described in the embodiment. For example, the LPF 131 may be configured to output a voltage Vin having a magnitude smaller than 50% of the voltage amplitude of the signal DQS_in or a voltage Vin having a magnitude larger than 50% of the voltage amplitude of the signal DQS_in upon input the signal DQS_in having a 50% duty cycle.

In the foregoing embodiment, the example in which the voltage Vref is a direct voltage having ½ of the voltage amplitude of the signal DQS_in was explained. The magnitude of the voltage Vref is not limited to the above example. The magnitude of the voltage Vref can be discretionarily determined as long as it is smaller than the maximum value of an output voltage of the ramp circuit 133 and comparable by the comparator 134. As long as the condition is satisfied, the magnitude of the voltage Vref may be larger or smaller than ½ of the voltage amplitude of the signal DQS_in.

In the foregoing embodiment, an example in which the signal CLK obtained by dividing the signal DQS_in by the divider 135 is output and the counter 136 and the controller 138 are operated based on the signal CLK was explained. The signal CLK that determines the operation timing of the counter 136 and the controller 138 is not limited to the example described in the embodiment. The divider 135 may be omitted and the signal DQS_in may be used as the signal CLK. For example, the signal CLK may be a signal based on a signal other than the signal DQS_in, or a signal other than the signal DQS_in may be used, or a signal may be supplied from an oscillator.

The embodiments of the present invention have been explained. These are presented merely as examples and are not intended to restrict the scope of the invention. These embodiments may be realized in various other forms, and various omissions, replacements, and changes can be made without departing from the gist of the invention. Such embodiments and modifications are included in the scope and gist of the invention, and are included in the scope of the invention described in the claims and its equivalents.

The invention claimed is:

1. A detection circuit comprising:
a first filter circuit configured to output a first voltage based on a first signal;
a ramp circuit configured to output a ramp voltage;
a comparator configured to output a first result of comparison between the first voltage and the ramp voltage and a second result of comparison between a second voltage and the ramp voltage; and
a controller, wherein
the controller determines, based on the first comparison result, a first period of time between a time when an output of the ramp voltage is started and a time when a magnitude correlation between the first voltage and the ramp voltage is inverted, and determines, based on the second comparison result, a second period of time between a time when an output of the ramp voltage is started and a time when a magnitude correlation between the second voltage and the ramp voltage is inverted.

2. The circuit of claim 1, wherein
the controller includes a counter, and
the controller controls the counter based on the first comparison result and stores a first count value corresponding to the first period, and controls the counter based on the second caparison result and stores a second count value corresponding to the second period.

3. The circuit of claim 1, further comprising
a selector to which the first voltage and the second voltage are input and which is configured to output the first voltage or the second voltage to the comparator, wherein
the controller is configured to select a voltage that is output from the selector.

4. The circuit of claim 1, wherein
the ramp voltage includes a first ramp voltage and the second ramp voltage, and
the comparator outputs a result of comparing the first voltage with the first ramp voltage as the first comparison result and outputs a result of comparing the second voltage with the second ramp voltage as the second comparison result.

5. The circuit of claim 2, wherein
the counter operates at a timing based on the first signal.

6. The circuit of claim 1, wherein
the second voltage is ½ of a voltage amplitude of the first signal.

7. The circuit of claim 1, further comprising:
a second filter circuit configured to output the second voltage based on a second signal which is an inverted signal of the first signal.

8. The circuit of claim 1, further comprising:
a second filter circuit configured to output a third voltage based on a second signal which is an inverted signal of the first signal, wherein
the comparator further outputs a third comparison result obtained by comparing the third voltage with the ramp voltage, and
the controller is configured to further determine a third period between when an output of the ramp voltage is commenced based on the third comparison result and the magnitude correlation between the third voltage and the ramp voltage is reversed.

9. The circuit of claim 1, wherein
the first filter circuit is a low-pass filter.

10. The circuit of claim 2, wherein the counter determines the first count value and the second count value based on a clock frequency of the first signal.

11. A semiconductor memory device, including:
the circuit of claim 1;
a correction circuit configured to receive a third signal that is eternally input and to correct a duty cycle of the third signal based on a parameter and output the corrected third signal as the first signal;
a memory cell array configured to store data; and
an output circuit configured to externally output the data based on the first signal, wherein
the correction circuit is configured to change the parameter based on the first period and the second period.

12. The device of claim 11, wherein
the correction circuit is configured to change the parameter based on a ratio between the first period and the second period.

13. A semiconductor memory device, including:
the circuit of claim 8;
a correction circuit to which a third signal is externally input and which is configured to correct a duty cycle of the third signal based on the parameter to output the corrected third signal as the first signal;
a memory cell configured to store data; and
an output circuit configured to externally output the data based on the first signal, wherein
the correction circuit changes the parameter based on the first period, the second period, and the third period.

14. The device of claim 13, wherein
the correction circuit is configured to
change the parameter based on a ratio between the first period and the second period and a ratio between the third period and the second period.

15. The device of claim 11, wherein
the data is read based on a timing of the third signal.

16. A memory system comprising:
the device of claim 11; and
a memory controller configured to output the third signal and receive the first signal and the data.

\* \* \* \* \*